(12) United States Patent
Masleid et al.

(10) Patent No.: US 9,178,505 B2
(45) Date of Patent: Nov. 3, 2015

(54) CROSS POINT SWITCH

(75) Inventors: Robert P. Masleid, Monte Sereno, CA (US); Scott Pitkethly, Redwood City, CA (US)

(73) Assignee: INTELLECTUAL VENTURE FUNDING LLC, Carson City, NV (US)

(*) Notice: Subject to any disclaimer, the term of this patent is extended or adjusted under 35 U.S.C. 154(b) by 231 days.

(21) Appl. No.: 12/715,105

(22) Filed: Mar. 1, 2010

(65) Prior Publication Data

US 2010/0156504 A1    Jun. 24, 2010

Related U.S. Application Data

(63) Continuation of application No. 11/479,618, filed on Jun. 30, 2006, now Pat. No. 7,710,153.

(51) Int. Cl.
*H03K 19/094* (2006.01)
*H03K 17/00* (2006.01)

(52) U.S. Cl.
CPC .................................. *H03K 17/002* (2013.01)

(58) Field of Classification Search
CPC .................................................. H03K 19/1737
USPC ......................................... 326/82–87, 26–30
See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,620,310 A | 10/1986 | Lvovsky et al. | |
| 4,739,252 A | 4/1988 | Malaviya et al. | |
| 4,779,013 A | 10/1988 | Tanaka | |
| 4,820,942 A * | 4/1989 | Chan ............................ | 327/310 |
| 4,829,199 A | 5/1989 | Prater | |
| 5,128,560 A | 7/1992 | Chern et al. | |
| 5,166,555 A | 11/1992 | Kano | |
| 5,264,738 A | 11/1993 | Veendrick et al. | |
| 5,297,086 A | 3/1994 | Nasu et al. | |
| 5,304,867 A | 4/1994 | Morris | |
| 5,321,326 A | 6/1994 | Shigehara et al. | |
| 5,399,925 A | 3/1995 | Nguyen | |
| 5,410,278 A | 4/1995 | Itoh et al. | |
| 5,414,312 A | 5/1995 | Wong | |
| 5,453,719 A | 9/1995 | Narahara | |
| 5,455,521 A | 10/1995 | Dobbelaere | |
| 5,467,038 A | 11/1995 | Motley et al. | |
| 5,497,105 A | 3/1996 | Oh et al. | |

(Continued)

FOREIGN PATENT DOCUMENTS

| | | |
|---|---|---|
| EP | 1398639 | 3/2004 |
| JP | 3089624 | 4/1991 |
| JP | 04091516 | 3/1992 |

OTHER PUBLICATIONS

Chen, G., et al., "Dynamic NBTI of P-MOS Transistors and Its Impact on MOSFET Scaling"; IEEE Electron Device Letters, 2002.

(Continued)

*Primary Examiner* — Daniel D Chang

(57) ABSTRACT

A cross point switch, in accordance with one embodiment of the present invention, includes a plurality of tri-state repeaters coupled to form a plurality of multiplexers. Each set of corresponding tri-state repeaters in the plurality of multiplexers share a front end module such that delay through the cross point switch due to input capacitance is reduced as compared to conventional cross point switches.

20 Claims, 7 Drawing Sheets

(56) References Cited

U.S. PATENT DOCUMENTS

| | | |
|---|---|---|
| 5,524,616 A | 6/1996 | Smith et al. |
| 5,541,921 A * | 7/1996 | Swenson et al. .............. 370/376 |
| 5,557,223 A | 9/1996 | Kuo |
| 5,568,103 A | 10/1996 | Nakashima et al. |
| 5,594,360 A | 1/1997 | Wojciechowski |
| 5,610,548 A | 3/1997 | Masleid |
| 5,619,511 A | 4/1997 | Sugisawa et al. |
| 5,677,650 A | 10/1997 | Kwasniewski et al. |
| 5,680,359 A | 10/1997 | Jeong |
| 5,698,994 A | 12/1997 | Tsuji |
| 5,699,000 A | 12/1997 | Ishikuri |
| 5,739,715 A | 4/1998 | Rawson |
| 5,764,110 A | 6/1998 | Ishibashi |
| 5,767,700 A | 6/1998 | Lee |
| 5,791,715 A | 8/1998 | Nebel |
| 5,796,313 A | 8/1998 | Eitan |
| 5,811,983 A | 9/1998 | Lundberg |
| 5,880,608 A | 3/1999 | Mehta et al. |
| 5,926,050 A | 7/1999 | Proebsting |
| 5,933,027 A | 8/1999 | Morris et al. |
| 5,952,848 A | 9/1999 | Morris |
| 5,963,043 A | 10/1999 | Nassif |
| 5,969,543 A | 10/1999 | Erickson et al. |
| 5,977,763 A | 11/1999 | Loughmiller et al. |
| 5,982,211 A | 11/1999 | Ko |
| 5,999,022 A | 12/1999 | Iwata et al. |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gersbach |
| 6,043,698 A | 3/2000 | Hill |
| 6,044,027 A | 3/2000 | Zheng et al. |
| 6,066,958 A | 5/2000 | Taniguchi et al. |
| 6,087,886 A | 7/2000 | Ko |
| 6,114,840 A | 9/2000 | Farrell et al. |
| 6,127,872 A | 10/2000 | Kumata |
| 6,154,099 A | 11/2000 | Suzuki et al. |
| 6,154,100 A | 11/2000 | Okamoto |
| 6,172,545 B1 | 1/2001 | Ishii |
| 6,172,943 B1 | 1/2001 | Yuzuki |
| 6,188,260 B1 | 2/2001 | Stotz et al. |
| 6,222,585 B1 | 4/2001 | Endoh |
| 6,229,747 B1 | 5/2001 | Cho et al. |
| 6,236,236 B1 | 5/2001 | Chen |
| 6,239,617 B1 * | 5/2001 | Guertin et al. ................... 326/81 |
| 6,242,936 B1 | 6/2001 | Ho et al. |
| 6,242,937 B1 | 6/2001 | Lee et al. |
| 6,262,601 B1 | 7/2001 | Choe et al. |
| 6,262,616 B1 | 7/2001 | Srinivasan et al. |
| 6,281,706 B1 * | 8/2001 | Wert et al. ........................ 326/83 |
| 6,307,409 B1 | 10/2001 | Wrathall |
| 6,321,282 B1 | 11/2001 | Horowitz et al. |
| 6,335,638 B1 | 1/2002 | Kwong et al. |
| 6,346,829 B1 | 2/2002 | Coddington |
| 6,351,149 B1 | 2/2002 | Miyabe |
| 6,407,571 B1 | 6/2002 | Furuya et al. |
| 6,426,641 B1 | 7/2002 | Koch et al. |
| 6,455,901 B2 | 9/2002 | Kameyama et al. |
| 6,476,632 B1 | 11/2002 | La Rosa et al. |
| 6,489,796 B2 | 12/2002 | Tomishima |
| 6,496,045 B1 | 12/2002 | Nguyen |
| 6,532,544 B1 | 3/2003 | Masleid et al. |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,608,505 B2 | 8/2003 | Tsuji |
| 6,621,318 B1 | 9/2003 | Burr |
| 6,629,171 B2 * | 9/2003 | Muljono ...................... 710/100 |
| 6,630,851 B2 | 10/2003 | Masleid |
| 6,657,504 B1 | 12/2003 | Deal et al. |
| 6,674,671 B1 * | 1/2004 | Campbell et al. ........ 365/189.05 |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,731,440 B1 | 5/2004 | Komatsu et al. |
| 6,759,863 B2 | 7/2004 | Moore |
| 6,762,966 B1 | 7/2004 | LaRosa et al. |
| 6,768,363 B2 | 7/2004 | Yoo et al. |
| 6,774,734 B2 | 8/2004 | Christensen et al. |
| 6,784,717 B1 | 8/2004 | Hunt et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,838,906 B2 | 1/2005 | Yen |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 6,980,018 B2 | 12/2005 | Ngo et al. |
| 6,995,584 B1 | 2/2006 | Nguyen et al. |
| 7,002,377 B2 * | 2/2006 | Mori ............................... 327/18 |
| 7,053,660 B2 | 5/2006 | Itoh et al. |
| 7,053,680 B2 | 5/2006 | Masleid et al. |
| 7,142,018 B2 | 11/2006 | Masleid et al. |
| 7,164,305 B2 * | 1/2007 | Gupta et al. ................... 327/333 |
| 7,167,038 B2 | 1/2007 | Maxwell |
| 7,173,455 B2 | 2/2007 | Masleid et al. |
| 7,239,170 B2 | 7/2007 | Suen et al. |
| 7,254,728 B2 | 8/2007 | Rose et al. |
| 2001/0000426 A1 | 4/2001 | Sung et al. |
| 2001/0026178 A1 | 10/2001 | Itoh et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0101945 A1 | 8/2002 | Audy et al. |
| 2002/0172232 A1 * | 11/2002 | Dobberpuhl .................. 370/537 |
| 2002/0178415 A1 | 11/2002 | Saraf |
| 2003/0057775 A1 | 3/2003 | Yamashita et al. |
| 2003/0063605 A1 | 4/2003 | Ravi et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0148111 A1 | 7/2004 | Gauthier et al. |
| 2004/0257115 A1 | 12/2004 | Bertram et al. |
| 2005/0024101 A1 | 2/2005 | Reed et al. |
| 2005/0184720 A1 | 8/2005 | Bernstein et al. |
| 2005/0212547 A1 | 9/2005 | Suzuki |
| 2005/0212553 A1 * | 9/2005 | Best et al. ........................ 326/30 |
| 2005/0248368 A1 | 11/2005 | Bertram et al. |
| 2007/0018681 A1 * | 1/2007 | Sartschev ........................ 326/30 |
| 2007/0241771 A1 | 10/2007 | Schmit et al. |
| 2008/0301511 A1 * | 12/2008 | Miller et al. .................. 714/733 |

OTHER PUBLICATIONS

Lima T., et al., "Capacitance Coupling Immune, Transient Sensitive Accelerator for Resistive Interconnect Signals of Subquarter Micron ULSI" IEEE Journal of Solid-State Circuits, IEEE Inc. New York, US pp. 531-536.

Nalamalpu, et al., "Boosters for Driving Long OnChip Interconnects-Design Issues, Interconnect Synthesis, and Comparison With Repeaters", Jan. 2002, IEEE Transactions on Computer-Aided Design of Integrated Circuits and Systems, vol. 21, No. 1, pp. 50-62.

Oner et al., "A compact Monitoring Circuit for Real-Time On-Chip Diagnosis of Hot-Carrier Induced Degradation" Microelectronic test structures. Proceedings, IEEE International Conference in Monterey, CA. Mar. 17, 1997-Mar. 20, 1997, pp. 72-76.

(56) References Cited

OTHER PUBLICATIONS

Peters, Laura. "NBTI: A Growing Threat to Device Reliability," Semiconductor International. Mar. 1, 2004 Http://www.reed-electronics.com/semiconductor/article/CA386329?industiyid=3033.

Reddy. V. et al., "Impact of Negative Bias Temperature Instability on Digital Circuit Reliability". 2002 IEE International Reliabilty Physics Symposium Proceedings, Dallas, TX Apr. 7, 2002-Apr. 11, 2002.

Rhyne, "Fundamentals of Digital Systems Design", N.J. 1973, pp. 70-71 (326P11P1).

Non-Final OA Mailed May 14, 2008; 11479618.

Notice of Allowance Mailed Nov. 12, 2008; 11479618.

Non-Final OA Mailed Jan. 29, 2009; 11479618.

Non-Final OA Mailed Aug. 4, 2009; 11479618.

Notice of Allowance Mailed Nov. 30, 2009; 11479618.

* cited by examiner

CROSS POINT SWITCH

REFERENCE TO RELATED APPLICATIONS

This application is a Continuation of U.S. patent application Ser. No. 11/479,618, filed on Jun. 30, 2006, which is hereby incorporated by reference in its entirety.

BACKGROUND OF THE INVENTION

In integrated circuit (IC) chip designs, signals (e.g., clock signals, logic signals, power signals, etc.) may propagate along "long" metal wires in comparison to minimum design sizes available in the fabrication process utilized. Propagation delay and distortion are some of the negative effects experienced by the signals propagating along the long metal wires. These negative effects can be minimized by reducing the RC constant of the metal wire. However, in some IC chip designs, the maximum reduction in the RC constant is not sufficient to meet the design specifications. Thus, other techniques are used. One approach involves inserting repeater circuits at periodic intervals along the long metal wires in order to amplify (or remove distortion) the signals as well as to reduce propagation delay (or maintain fast transition times). However, conventional repeaters introduce a propagation delay as a result of one or more parasitic capacitances.

SUMMARY OF THE INVENTION

Embodiments of the present invention are directed toward a cross point switch that includes a plurality of tri-state repeaters coupled to form a plurality of multiplexers. Each set of corresponding tri-state repeaters in the plurality of multiplexers share a front end module such that delay through the cross point switch due to input capacitance is reduced as compared to conventional cross point switches. Each tri-state repeater includes an up drive module for generating a hard first drive state, a down drive module for generating a hard second drive state and a keeper module for generating a weak first drive state and a weak second drive state. The tri-state repeater further includes an enable module, wherein the output of the tri-state repeater operates in one of four states that includes the hard first drive state, the weak first drive state, the hard second drive state and the weak second drive state when a corresponding select signal is in a first enable state. Furthermore, the output operates in a moderate or high impedance state when the corresponding select signal is in a second enable state

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
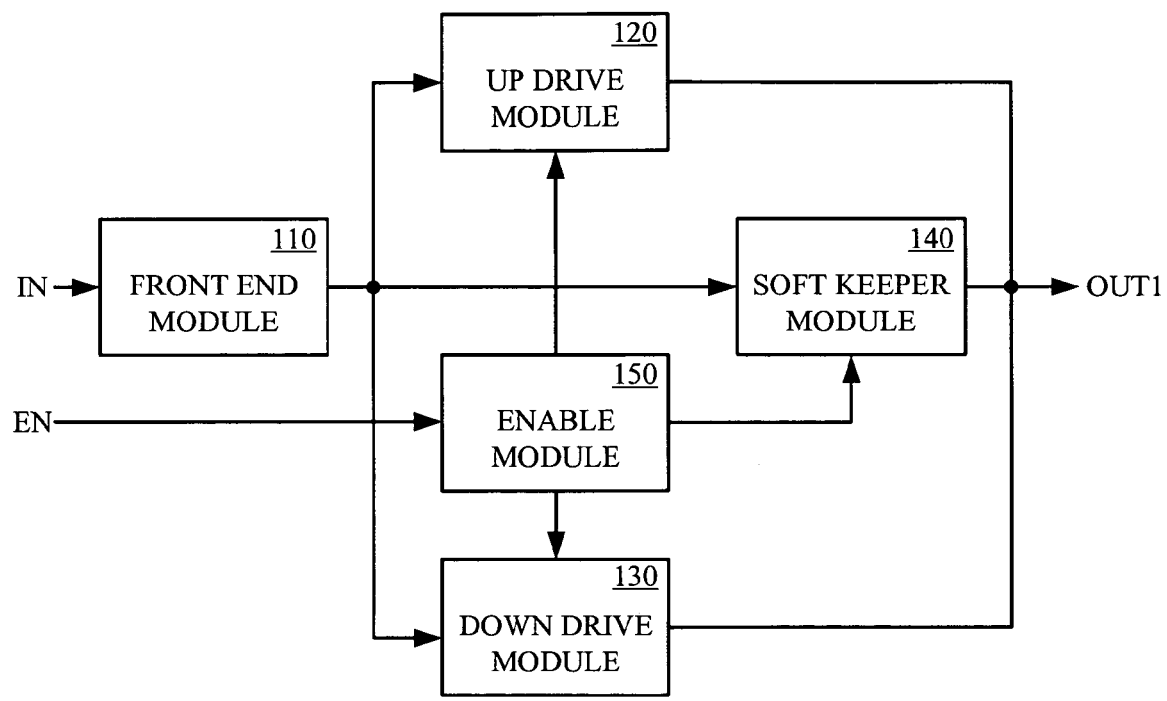
FIG. 1 shows a block diagram of a tri-state repeater, in accordance with one embodiment of the present invention.

Referring to FIG. 1, a tri-state repeater, in accordance with one embodiment of the present invention, is shown. The tri-state repeater 100 includes a front end functional module 110, an up-drive functional module 120, a down-drive functional module 130, a keeper functional module 140 and an enable functional module 150. The up-drive module 120, down-drive module 130 and keeper module 140 are coupled to the front end module 110. The enable module 150 is coupled to the up-drive module 120, down-drive module 130 and the keeper module 140. The output of the up-drive module 120, down-drive module 130 and keeper module 140 are coupled together as a data output (OUT).

When the enable signal is in a first state, the output of the tri-state repeater 100 can operate in four possible states. When the input data signal transitions from a first state (e.g., low) to a second state (e.g., high), the up-drive module 120 causes the output to transition to a hard drive second state and remain in the hard drive second state for a period of time. After the period of time, the up-drive module 120 turns off and the keeper module 140 causes a weak drive second state to be provided by the output of the tri-state repeater 100. When the data signal transitions from the second state to the first state, the down-drive module 130 causes the output to transition to a hard drive first state and remain in the hard drive first state for a period of time. After the period of time, the down-drive module 130 turns off and the keeper module 140 causes a weak drive first state to be provided by the output of the tri-state repeater 100.

When the enable signal is in a second state, the output of the up-drive module 120, down-drive module 130 and keeper module 140 are placed in a moderate or high impedance mode by the enable module 150. The enable module 150 effectively induces a weak keeper state when the enable input is in the second state if the load impedance coupled to the data output is sufficiently high that the output is not discharged. However, other circuits coupled to the output of the tri-state repeater 100 can drive the output to a given state when the enable signal is in the second state. Thus, the tri-state repeater 100 may be utilized, for example, to implement each of a plurality of drivers of a tri-state bus.

Figure 2:
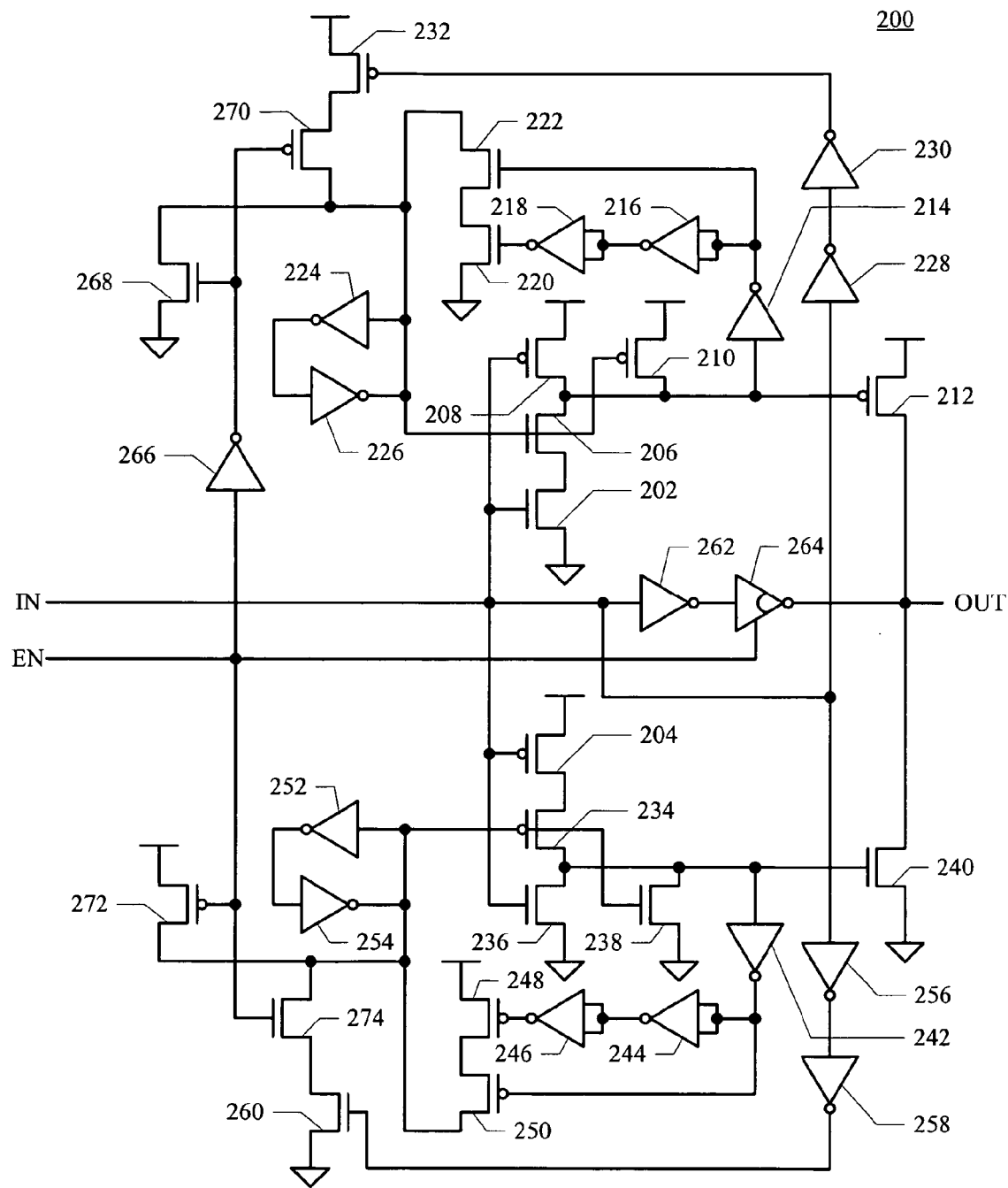
FIG. 2 shows a circuit diagram of a tri-state repeater, in accordance with another embodiment of the present invention.

Referring to FIG. 2, a tri-state repeater, in accordance with another embodiment of the present invention, is shown. The tri-state repeater 200 includes a first transistor 202 and second transistor 204 for implementing the front end functionality of the tri-state repeater 200. The gate of the first transistor 202 and the gate of the second transistor 204 are coupled to the input (IN) of the tri-state repeater 200. The drain of the first transistor 202 is coupled to a first potential (e.g., ground) and the drain of the second transistor 204 is coupled to a second potential (e.g., supply). In one implementation, the first transistor 202 may be an n-channel Metal Oxide Semiconductor Field Effect Transistor (MOSFET) and the second transistor 204 may be a p-channel MOSFET.

The tri-state repeater may further include a third, fourth and fifth transistor 206, 208, 210 coupled as a NAND gate. In particular, the drain of the third transistor 206 is coupled to the source of the first transistor 202. The gate of the fourth transistor 206 is a first input of the NAND gate, which is coupled to the input of the tri-state repeater 200. The gates of the third and fifth transistors 206, 210 are coupled together as a second input of the NAND gate. The source of the third transistor 206 and the source of the fourth and fifth transistor 208, 210 are coupled together as the output of the NAND gate. The output of the NAND gate is coupled to a gate of a sixth transistor 212. The source of the sixth transistor 212 is coupled to the second potential and the drain is coupled to the output (OUT) of the tri-state repeater 200. In one implementation, the third and sixth transistors 206, 212 may be p-channel MOSFETs and the fourth and fifth transistors 208, 210 may be p-channel MOSFETs.

The tri-state repeater 200 may further include first, second, and third inverters 214, 216, 218 and seventh and eighth transistors 220, 222. The input of the first inverter 214 is coupled to sources of the third, fourth and fifth transistors 206, 208, 210, which forms the output of the NAND gate. The input of the second inverter 216 is coupled to the output of the first inverter 214. The input of the third inverter 218 is coupled to the output of the second inverter 216. The gate of the seventh transistor 220 is coupled to the output of the third inverter 218. The drain of the seventh transistor 220 is coupled to the first potential. The source of the seventh transistor 220 is coupled to the drain of the eighth transistor 222. The gate of the eighth transistor 222 is coupled to the output of the first inverter 214.

Figure 3A:
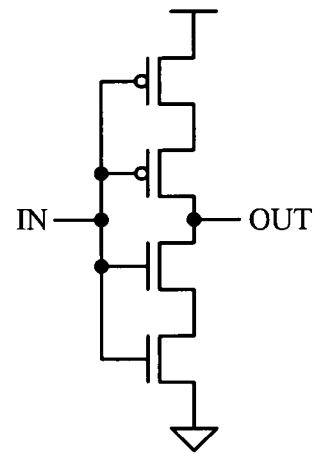
FIG. 3A shows a circuit diagram of an exemplary inverter utilized in a tri-state repeater, in accordance with one embodiment of the present invention.

In one implementation, the seventh and eighth transistors 220, 222 may be n-type MOSFETs. The inverters 214, 216, 218 may be implemented by a plurality of n-type and p-type MOSFETs coupled as a stacked push-pull inverter as depicted in FIG. 3A. Referring to FIG. 3A, the inverter may include two n-type transistors and two p-type transistors. The gates of all of the transistors are coupled together as the input of the inverter. The drain of a first p-type transistor is coupled to a supply potential. The drain of the second p-type transistor is coupled to the source of the first p-type transistor. The drain of a first n-type transistor is coupled to a ground potential. The source of the first n-type transistor is coupled to the drain of the second n-type transistor. The source of the second n-type transistor is coupled to the source of the second p-type transistor as the output of the inverter.

Referring again to FIG. 2, the second and third inverters 216, 218 in combination with the seventh transistor 220 implement a delay circuit. The first inverter 214 in combination with the eighth transistor 222 implement a rising edge delay select circuit.

The tri-state repeater 200 may further include a fourth and fifth inverter 224, 226 coupled as a latch. In particular, the input of the fourth inverter 224 is coupled to the source of the eighth transistor 222 and gates of the second and fourth transistor 206, 210. The output of the fourth inverter 224 is coupled to the input of the fifth inverter 226. The output of the fifth inverter 226 is coupled to the input of the fourth inverter 224.

The tri-state repeater 200 may further include sixth and seventh inverters 228, 230 and a ninth transistor 232 for implementing a falling edge reset circuit. The input of the sixth inverter 228 is coupled to the input of the tri-state repeater 200. The output of the sixth inverter 228 is coupled to the input of the seventh inverter 230. The output of the seventh inverter 230 is coupled to the gate of the ninth transistor 232. The drain of the ninth transistor 232 is coupled to the second potential. In one implementation the ninth transistor 232 may be a p-channel MOSFET.

The transistors 206-212, 220, 222, 232 and inverters 214-218, 224-230 that implement a NAND gate, delay circuit, the raising edge delay select circuit, the latch and the falling edge reset circuit provide the up-drive functionality of the tri-state repeater 200. Similarly, the transistors 234-240, 248, 250, 260 and inverters 242-246, 252-258 that implement a NOR gate, delay circuit, the falling edge delay select circuit, the latch and the rising edge reset circuit provide the down-drive functionality of the tri-state repeater 200.

The tri-state repeater further includes seventeenth and eighteenth inverters 262, 264. The input of the seventeenth inverter is coupled to the input of the tri-state repeater 200. The output of the seventeenth inverter is coupled to the input of the eighteenth inverter 264. The output of the eighteenth inverter 264 is coupled to the output of the tri-state repeater 200. The seventeenth and eighteenth inverters 262, 264 implement a keeper circuit of the tri-state repeater 200.

Normally, the output of the tri-state repeater 200 can operate in four possible states. When the input data signal (IN) transitions from a first state (e.g., low) to a second state (e.g., high), the up-drive functionality causes the output to transition to a hard drive second state and remain in the hard drive second state for a period of time. In particular, the rising edge at the input causes the output of the NAND gate to fall, generating the leading edge of a pulse. The fall in the output of the NAND gate turns on the output drive transistor 212, causing the output data signal (OUT) to drive hard. In addition, the rising edge at the input (IN) causes the output of the keeper circuit, at transistor 264, to rise.

After the period of time, the up-drive functionality turns off and the keeper functionality causes a weak drive second state to be provided by the output of the tri-state repeater 200. In particular, the falling output of the NAND gate causes the transistor 222 of the raising edge delay select circuit to turn on and then the transistor 218 of the delay circuit to turn on. Once the transistors 218 and 222 are both turned on, the latch circuit 224, 226 latches a logic low at the second input to the NAND gate. The latched low at the second input of the NAND gate causes the output of the NAND gate to rise, thereby turning off the output drive transistor 212. Although the hard drive provided by the output drive transistor 212 is turned off, the soft drive provided by the soft keeper circuit 262, 264 maintains the output of the tri-state repeater at a high state. In addition, the rising edge at the input of the tri-state repeater causes the rising edge reset circuit 256, 258, 260 to reset the down-drive functionality of the tri-state repeater 200.

Similarly, when the input data signal (IN) transitions from the high state to the low state, the down-drive functionality causes the output to transition to a hard drive low state and remain in the hard drive low state for a period of time. After the period of time, the down-drive functionality turns off and the keeper circuit causes a weak drive low state to be provided by the output (OUT) of the tri-state repeater 200.

Figure 3B:
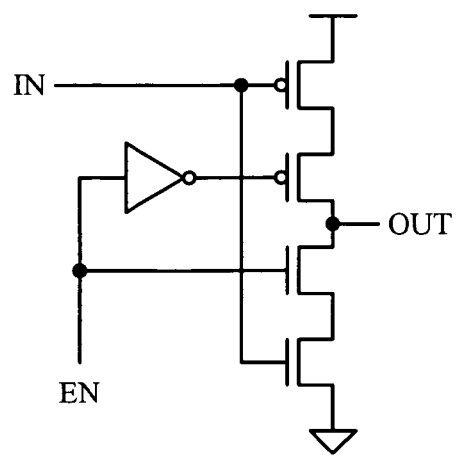
FIG. 3B shows a circuit diagram of an exemplary inverter having an enable control input utilized in a tri-state repeater, in accordance with one embodiment of the present invention.

The repeater also includes an enable circuit. In particular, an enable control input of the seventeenth inverter 264 places the output of the inverter in a high-impedance mode when the enable control input is a logic high. The enabled inverter 264 may be implemented by a plurality of n-channel and p-channel MOSFETs coupled as a stacked push-pull inverter having an enable control input as depicted in FIG. 3B. In addition, eighteenth and nineteenth inverter 266, 272 and nineteenth, twentieth, twenty first and twenty second transistors 268, 270, 274, 276 turn of the output drive transistors 212, 214. Accordingly, in a disabled mode, the tri-state repeater 200 is placed in a moderate or high impedance output mode.

Figure 4:
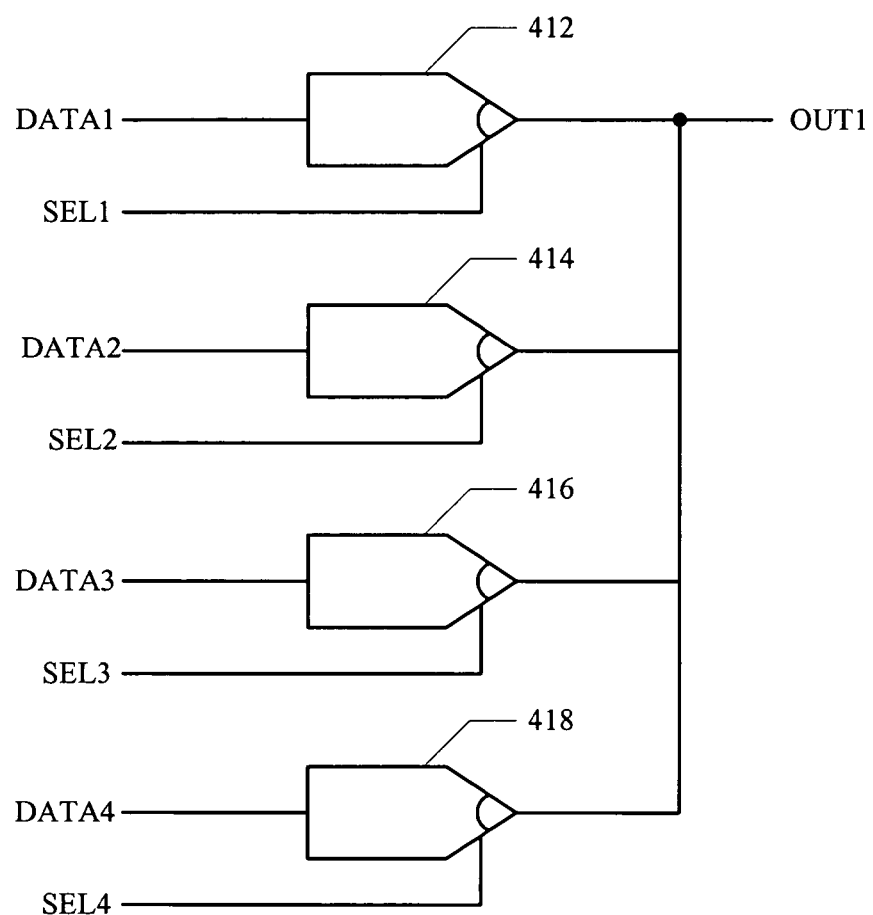
FIG. 4 shows a block diagram of a tri-state repeater multiplexer, in accordance with one embodiment of the present invention.

Referring to FIG. 4, a block diagram of a tri-state repeater multiplexer, in accordance with one embodiment of the present invention, is shown. The tri-state repeater multiplexer 400 includes a plurality of tri-state repeaters 412, 414, 416, 418. Each tri-state repeater includes a first input coupled to a corresponding input data signal. A second input of each tri-state repeater is coupled to a corresponding select signal. The output of each of the plurality tri-state repeaters are coupled together (e.g., dot) to provide an output data signal (OUT1). For example, a first tri-state repeater 412 has a first input coupled to a first input data signal (DATA1) and a second input coupled to a first select signal (SEL1), a second tri-state repeater 414 has a first input coupled to a second input data signal (DATA2) and a second input coupled to a second select signal (SEL2), and so on. When the tri-state repeater as described in FIG. 1 or 2 is utilized in the tri-state repeater multiplexer 400, the enable input is utilized as the corresponding select input.

Accordingly, the tri-state repeater multiplexer selects one or more of the plurality of input signals and directs it to the single output line. In one implementation, the plurality of select signals of the tri-state repeater multiplexer are configured to be a single active select signal. More particularly, one control signal can be in a first state and the other select signals are in a second state. As a result the input signal coupled to the tri-state repeater connected to the given select signal that is in the first state is repeated at the output of the tri-state repeater multiplexer.

Although, the select signals to the tri-state repeater multiplexer are illustrated as being a one of N active encoded control input signal, it is possible to include additional decode logic such that the select signals may be received as any type of encoded control input signal, such as log 2 of N.

Figure 5:
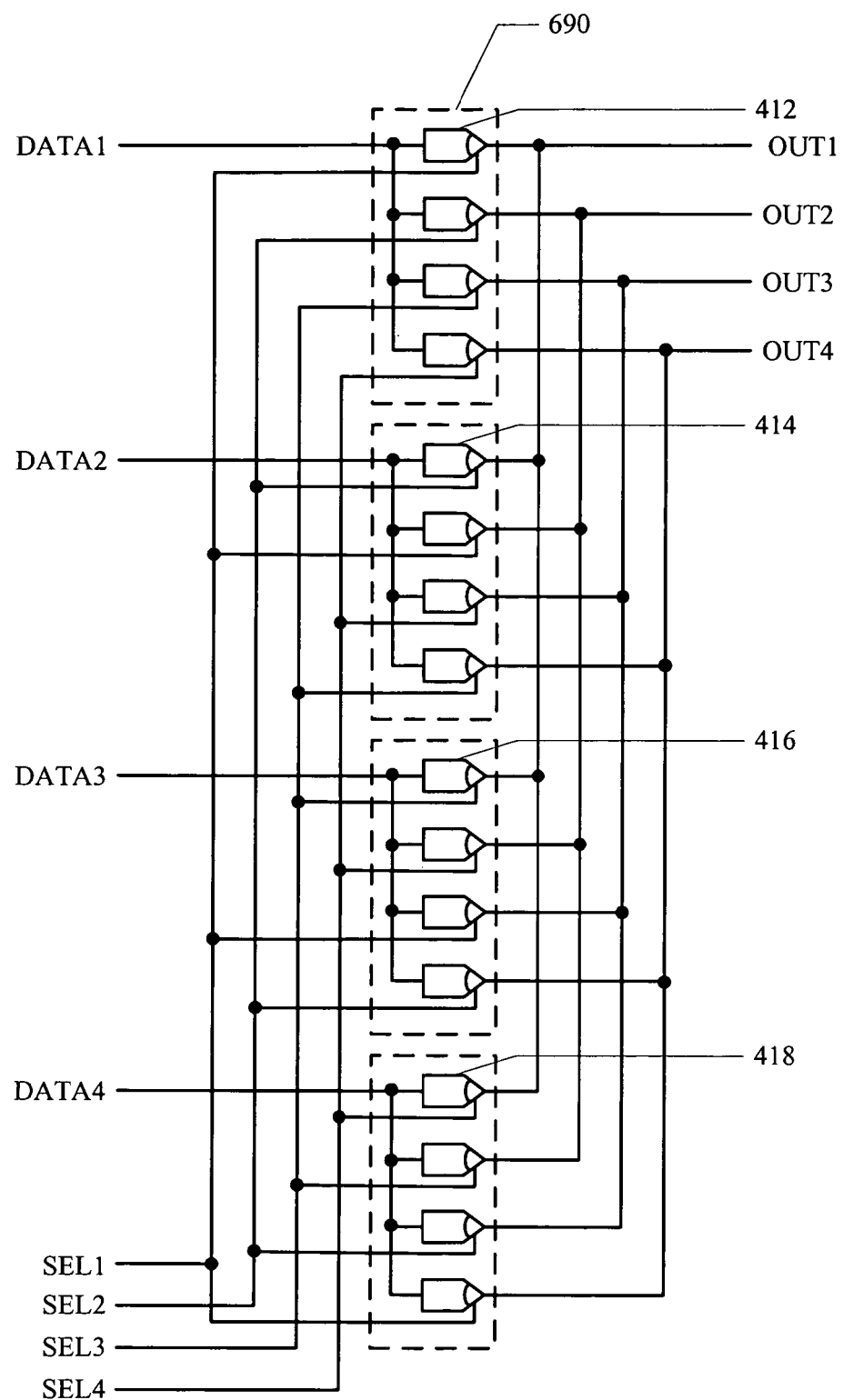
FIG. 5 shows a block diagram of an exemplary tri-state cross point switch, in accordance with one embodiment of the present invention.

Referring to FIG. 5, a block diagram of an exemplary tri-state cross point switch, in accordance with one embodiment of the present invention, is shown. The tri-state cross point switch includes a plurality of tri-state repeaters coupled to form a plurality of tri-state repeater multiplexers. For example, a first, second, third and fourth tri-state repeater 412, 414, 416, 418 may be coupled to implement a first tri-state repeater multiplexer of the tri-state cross point switch. The inputs and output of the tri-state repeater multiplexers may be coupled together in any number of permutations to implement a desired tri-state cross point switch functionality. The corresponding tri-state repeaters 690 in each tri-state repeater multiplexer are coupled to a common input signal. Accordingly, the corresponding tri-state repeaters 690 in each tri-state repeater multiplexer may utilize a common front-end module to reduce the delay of the tri-state cross point switch.

Figure 6A:
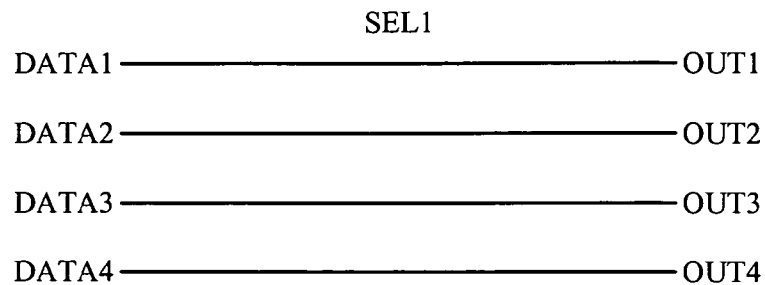
FIGS. 6A, 6B, 6C and 6D show signal switching diagrams illustrating operation of an exemplary tri-state cross point switch, in accordance with one embodiment of the present invention.
Figure 6B:
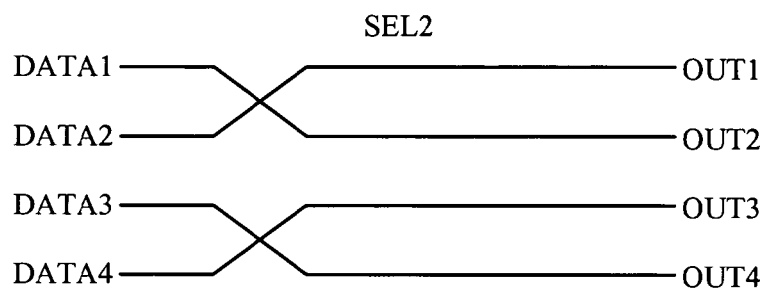

Operation of the tri-state cross point switch permutation shown in FIG. 5 is illustrated in FIGS. 6A, 6B, 6C and 6D. In FIG. 6A, each input data signal is repeated at the respective output when the first select control signal is in a first state and the other select control signals are in a second state. In FIG. 6B, the first data signal at the first input is repeated at the second output, the second data signal at the second input is repeated at the first output, the third data signal at the third input is repeated at the fourth output and the fourth data signal at the fourth input is repeated at the third output, when the second select control signal is in the first state and the other select control signals are in the second state.

Figure 6C:
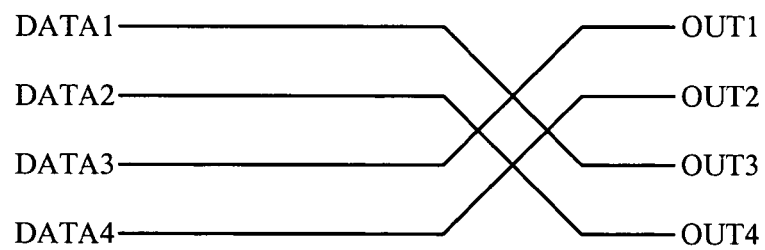

In FIG. 6C, the first data signal at the first input is repeated at the third output, the second data signal at the second input is repeated at the fourth output, the third data signal at the third input is repeated at the first output and the fourth data signal at the fourth input is repeated at the second output, when the third select control signal is in the first state and the other select control signals are in the second state.

Figure 6D:
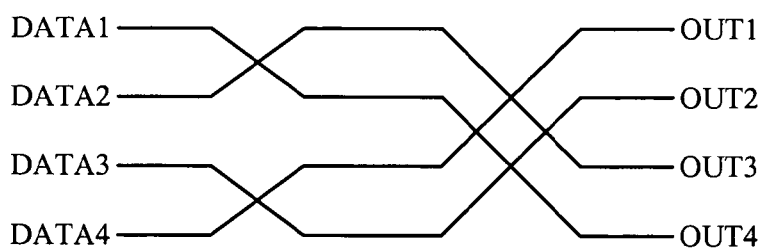

In FIG. 6D, the first data signal at the first input is repeated at the fourth output, the second data signal at the second input is repeated at the third output, the third data signal at the third input is repeated at the second output and the fourth data signal at the fourth input is repeated at the first output, when the fourth select control signal is in the first state and the other select control signals are in the second state.

It is appreciated that the tri-state repeater cross point switch shown in FIG. 5 and the operation illustrated in FIGS. 6A, 6B, 6C and 6D are exemplary and do not limit the claimed scope of the invention. Instead, many permutations are possible and a given one of the permutations may be utilized according to a particular application.

Figure 7:
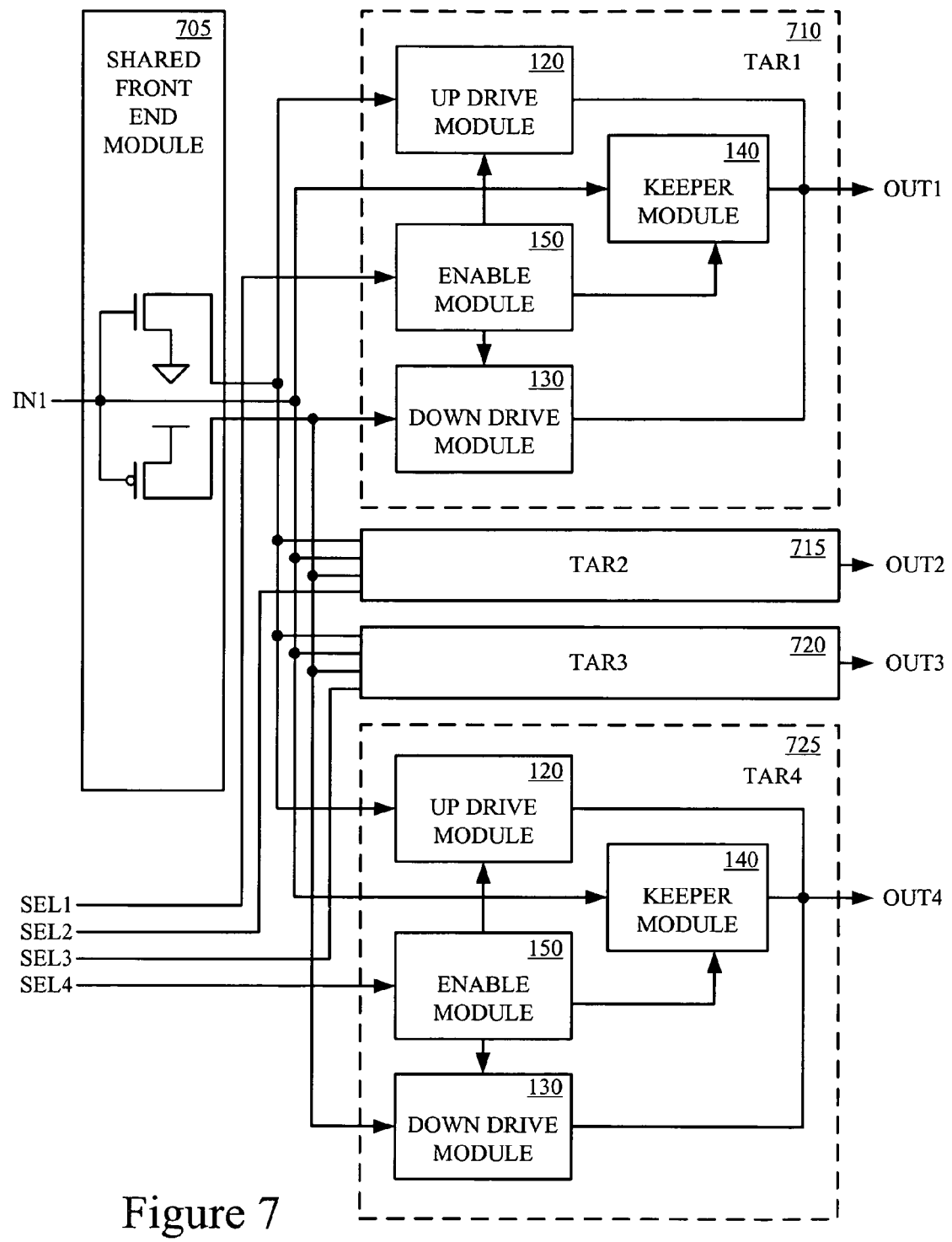
FIG. 7 shows a block diagram of a portion of an exemplary tri-state cross point switch, in accordance with another embodiment of the present invention.

Referring to FIG. 7, block diagram of a portion of the exemplary cross point switch in FIG. 5 is shown. As depicted in FIG. 7 a plurality of tri-state repeaters, in a cross point switch, may share an input stage. In particular a shared front end circuit 705 may receive a first input data signal (IN). The shared front end circuit 705 provides a high impedance input load. Furthermore, the shared front end circuit distributes the input data signal to a plurality of tri-state repeaters 710, 715, 720, 725. In one implementation, the shared front end circuit may include an N-MOSFET and a P-MOSFET. The drain of the N-MOSFET may be coupled to a first potential and the source of the N-MOSFET may be coupled to the up-drive circuit of each of a plurality of tri-state repeaters.

The shared front end circuit is coupled to the up drive and down drive modules of corresponding tri-state repeaters in each tri-state repeater multiplexer. For example the N-MOSFET of the shared front end circuit is coupled to the up drive modules 120 of the corresponding tri-state repeaters 710, 715, 720, 725 in each tri-state repeater multiplexer of the tri-state cross point switch 400. The P-MOSFET of the shared front end circuit is coupled to the down drive modules 130 of the corresponding tri-state repeaters 710, 715, 720, 725 in each tri-state repeater multiplexer of the tri-state cross point switch 400. Each set of corresponding tri-state repeaters in each tri-state repeater multiplexer include a corresponding shared front end circuit.

One of the tri-state repeaters will be active because the select signal is one of N active encoded. Accordingly, the transistors of the shared front end circuit may be utilized to provide current to the active one of N active tri-state repeaters. Because the transistors do not provide current to all N tri-state repeaters, the transistors of the shared front end circuit may be sized according to the current need by one tri-state repeater thereby reducing the input capacitance of the tri-state repeater multiplexer.

Thus, the select signals effectively hide the input impedance load of the N-1 tri-state repeaters. The reduced input impedance results in a reduced delay through the tri-state cross point switch. Furthermore, the output impedance load of the tri-state repeaters is dominated by the wire capacitance of the long output trace and not the output impedance of the tri-state repeaters. In addition, the output stage of the tri-state repeaters do not have to be sized to handle crowbar current because the output cycles through the four drive states (e.g., hard high, weak high, hard low and then weak low). Thus, the tri-state repeater is in a weak keeper state before the output stage has to be driven to the other state. As a consequence the output drive transistor may be sized smaller than for repeaters that have to handle crowbar current which reduces the output impedance. As a result, the impedance of the output trace remains the dominant output impedance.

Embodiments of the present invention advantageously implement a near-zero-insertion delay cross point switch. A substantially zero insertion delay is achieved because the device stacking delay penalty generally required by a multiplexer is hidden in the topology of the tri-state repeater. The parasitic side load from dotting repeater outputs is also minimal, as compared to the capacitance of the wire attached to the output. In addition, the FO4 delay to build the gain to drive four multiplexer inputs is avoided by sharing the large data input field effect transistors (FET). Furthermore, the parasitic side load from sharing the large data input FETs is the usual side load for a four-way AO1 (e.g., ~½ FO4 delay).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method comprising:
    coupling a first signal, an enable signal, and an inverted version of the enable signal as inputs to a plurality of gate terminals of a first inverter that is coupled in series with a second inverter between an input and an output, wherein the second inverter is configured to output the first signal;
    if the enable signal is in a first state and the inverted version of the enable signal is in a second state:
        turning on, for a period of time, one of a first drive circuit coupled to the output or a second drive circuit coupled to the output; and
        controlling the output to represent an input signal; and
    if the enable signal is in the second state and the inverted version of the enable signal is in the first state, controlling the output to operate in an impedance state.

2. The method of claim 1, wherein said controlling the output to represent the input signal comprises:
    driving the output to a hard first drive state.

3. The method of claim 2, wherein said controlling the output to represent the input signal comprises:
    driving the output to a weak first drive state.

4. The method of claim 2, wherein said controlling the output to represent the input signal comprises:
    driving the output to a hard second drive state.

5. The method of claim 3, wherein said controlling the output to represent the input signal comprises:
    driving the output to a weak second drive state.

6. The method of claim 1, wherein said controlling the output to operate in the impedance state comprises:
    setting the output to a moderate impedance state.

7. The method of claim 1, wherein said controlling the output to operate in the impedance state comprises:
    setting the output to a high impedance state.

8. A method comprising:
    coupling a first circuit to a first select line and a first input line;
    coupling a second circuit to a second select line and a second input line;
    coupling an output of the first circuit and an output of the second circuit to an output line;
    if the first select line is in a first state and the second select line is in a second state:
        turning on, for a first period of time, and turning off one of a first drive circuit of the first circuit or a second drive circuit of the first circuit;
        controlling the output of the first circuit to represent an input signal in the first input line at the output line; and
        controlling the output of the second circuit to operate in an impedance state; and
    if the first select line is in the second state and the second select line is in the first state:
        turning on, for a second period of time, and turning off one of a third drive circuit of the second circuit or a fourth drive circuit of the second circuit;
        controlling the output of the first circuit to operate in the impedance state; and
        controlling the output of the second circuit to represent an input signal in the second input line at the output line.

9. The method of claim 8, wherein said controlling the output of the first circuit to represent the input signal in the first input line comprises:
    driving the output to a hard first drive state.

10. The method of claim 9, wherein said controlling the output of the first circuit to represent the input signal in the first input line comprises:
    driving the output to a weak first drive state.

11. The method of claim 9, wherein said controlling the output of the first circuit to represent the input signal in the first input line comprises:
    driving the output to a hard second drive state.

12. The method of claim 9, wherein said controlling the output of the first circuit to represent the input signal in the first input line comprises:
    driving the output to a weak second drive state.

13. The method of claim 8, wherein said controlling the output of the first circuit to operate in the impedance state comprises:
    setting the output to a moderate impedance state.

14. The method of claim 8, wherein said controlling the output of the first circuit to operate in the impedance state comprises:
    setting the output to a high impedance state.

15. The method of claim 8, wherein said controlling the output of the first circuit to represent the input signal includes operating the output of the first circuit in a plurality of states including a hard first drive state, a weak first drive state, a hard second drive state, and a weak second drive state, and wherein said controlling the output of the second circuit to represent the input signal includes operating the output of the second circuit in the plurality of states.

16. A method comprising:
coupling a first plurality of circuits to a first input line and to a plurality of output nodes;
coupling a second plurality of circuits to a second input line and to the plurality of output nodes;
coupling a first select line to at least one circuit of the first plurality of circuits and to at least one circuit of the second plurality of circuits;
coupling a second select line to at least one circuit of the first plurality of circuits and to at least one circuit of the second plurality of circuits; and
by using the first select line and the second select line, selecting at least one signal path from the first input line to the output nodes and selecting at least one signal path from the second input line to the output nodes.

17. The method of claim 16, wherein the selecting at least one signal path from the first input line to the output nodes and selecting at least one signal path from the second input line to the output nodes comprises:
if the first select line is in a first state and the second select line is in a second state, selecting a first signal path from the first input line to a first output node of the output nodes and selecting a second signal path from the second input line to a second output node of the output nodes.

18. The method of claim 17, wherein the selecting at least one signal path from the first input line to the output nodes and selecting at least one signal path from the second input line to the output nodes further comprises:
if the first select line is in the second state and the second select line is in the first state, selecting a third signal path from the first input line to the second output node of the output nodes and selecting a fourth signal path from the second input line to the first output node of the output nodes.

19. The method of claim 16, further comprising:
coupling a third select line to at least one circuit of the first plurality of circuits and to at least one circuit of the second plurality of circuits; and
by using the first select line, the second select line, and the third select line, selecting at least one signal path from the first input line to the output nodes and selecting at least one signal path from the second input line to the output nodes.

20. The method of claim 19, further comprising:
coupling a fourth select line to at least one circuit of the first plurality of circuits and to at least one circuit of the second plurality of circuits; and
by using the first select line, the second select line, the third select line, and the fourth select line, selecting at least one signal path from the first input line to the output nodes and selecting at least one signal path from the second input line to the output nodes.

\* \* \* \* \*